United States Patent
Wu et al.

(10) Patent No.: US 11,501,933 B2
(45) Date of Patent: Nov. 15, 2022

(54) STRAIN SENSING KEY MEMBRANE

(71) Applicant: Apple Inc., Cupertino, CA (US)

(72) Inventors: Chia Chi Wu, Taipei (TW); Michael Vosgueritchian, San Francisco, CA (US); Ming Gao, Shanghai (CN); Nan Chen, Shanghai (CN); Vyom Sharma, Portland, OR (US); Wenhao Wang, Shanghai (CN)

(73) Assignee: APPLE INC., Cupertino, CA (US)

( * ) Notice: Subject to any disclaimer, the term of this patent is extended or adjusted under 35 U.S.C. 154(b) by 558 days.

(21) Appl. No.: 16/586,280

(22) Filed: Sep. 27, 2019

(65) Prior Publication Data
US 2021/0098210 A1    Apr. 1, 2021

(51) Int. Cl.
*H01H 13/84* (2006.01)
*H01H 13/7065* (2006.01)
*G01L 1/18* (2006.01)
*G01L 1/22* (2006.01)

(52) U.S. Cl.
CPC ............... *H01H 13/84* (2013.01); *G01L 1/18* (2013.01); *G01L 1/2287* (2013.01); *H01H 13/7065* (2013.01); *H01H 2221/002* (2013.01); *H01H 2300/03* (2013.01)

(58) Field of Classification Search
CPC ........... H01H 2201/02; H01H 13/7065; H01H 13/84; H01H 2300/03; H01H 2221/002; H01H 2215/052
See application file for complete search history.

(56) References Cited

U.S. PATENT DOCUMENTS

| | | | |
|---|---|---|---|
| 3,940,637 A | 2/1976 | Ohigashi et al. | |
| 6,331,849 B1 * | 12/2001 | VandenBoom | G05G 9/047 345/157 |
| 6,353,431 B1 * | 3/2002 | Poole | G06F 3/0338 345/161 |
| 10,128,062 B2 * | 11/2018 | Towers | H01H 13/52 |
| 2017/0194114 A1 | 7/2017 | Towers | |

FOREIGN PATENT DOCUMENTS

| | | |
|---|---|---|
| DE | 10241220 C1 | 10/2003 |
| JP | 2004213164 A | 7/2004 |
| JP | 2018072451 A | 5/2018 |

* cited by examiner

*Primary Examiner* — Edwin A. Leon
(74) *Attorney, Agent, or Firm* — Dorsey & Whitney LLP

(57) ABSTRACT

An electronic device has a keyboard with an internal membrane. The membrane has a set of strain gauges configured to respond to a key press, such as when a collapsible dome collapses into contact with the membrane. The strain gauges are connected in a half Wheatstone bridge configuration and are positioned on the membrane in order to limit effects of temperature and subtle flexure of the membrane. The strain gauges are also configured to magnify detection of a resistance differential when a keycap is pressed with sufficient force.

20 Claims, 6 Drawing Sheets

STRAIN SENSING KEY MEMBRANE

FIELD

The described embodiments relate generally to keyboard structures for electronic devices. More particularly, the present embodiments relate to strain-sensitive membrane structures for keyboards.

BACKGROUND

It is becoming more and more desirable within the industry to reduce the size and thickness, of various electronic devices such as, for example, laptop computers, keyboards, and related equipment and accessories. In doing so, device designers seek to reduce the size and number of components in keyboards and other input devices while preserving their strength, operational life, and reliability.

However, when certain types of keyboard parts are miniaturized or thinned, their stiffness can be reduced and their susceptibility to damage or debris can be negatively increased. Some parts cannot be miniaturized or otherwise reduced in thickness while maintaining desired key travel and key feel. Furthermore, many keyboards are limited in the types of input that they can provide. Typical keyboards only provide a single, on-or-off signal to a controller while other input devices such as touch pads and touchscreens can provide more dynamic input. Accordingly, there is a constant need for improvements to the effectiveness of keyboard structures.

SUMMARY

One aspect of the disclosure relates to a keyboard having a base, a keycap configured to translate relative to the base along an axis, and a membrane layer positioned between the keycap and the base. The membrane layer can include a flexible sheet, a first strain gauge positioned on the flexible sheet between the keycap and the base, with the first strain gauge being aligned with the axis, a second strain gauge positioned on the flexible sheet between the keycap and the base, with the second strain gauge being spaced apart from the axis, and a conductor positioned on the flexible sheet and connecting the first and second strain gauges in a half bridge configuration.

In some embodiments, the first strain gauge has a first unstressed resistance and the second strain gauge has a second unstressed resistance, and the keyboard further comprises a mechanical support linking the keycap to the base and a third strain gauge positioned on the flexible sheet between the keycap and the base at a position opposite the first strain gauge relative to the second strain gauge, with the third strain gauge having a third unstressed resistance, the second unstressed resistance being equal to the third unstressed resistance, and the first unstressed resistance being equal to a sum of the second and third unstressed resistance. The keyboard can also have a collapsible dome vertically aligned with the first, second, and third strain gauges, and the collapsible dome can be configured to collapse to deflect the first strain gauge more than the second or third strain gauges.

The flexible sheet can comprise a keycap-facing surface, wherein the first and second strain gauges are both positioned on the keycap-facing surface. The first strain gauge can comprise a first primary stress axis and the second strain gauge comprises a second primary stress axis, with the first and second primary stress axes being parallel. The base can comprise a recess or opening aligned with the axis, wherein the first strain gauge is deflectable into the recess or opening. The base can comprise a recess or opening vertically aligned with the keycap, wherein the second strain gauge is positioned on the flexible sheet spaced apart from the recess or opening. The keyboard can also further comprise a third strain gauge positioned on the flexible sheet between the keycap and the base. A collapsible dome can be positioned between the keycap and the base and can be configured to deflect the first strain gauge upon collapse.

In another aspect of the disclosure, a keyboard is provided that comprises a base structure, a keycap, a membrane positioned between the base structure and the keycap, a first piezoresistor, a second piezoresistor, and a third piezoresistor positioned on the membrane between the keycap and the base structure, with the second and third piezoresistors being symmetrically positioned on opposite sides of the first piezoresistor, and a conductive material configured to link the first, second, and third piezoresistors to a voltage source and to a voltage measurement device.

In some configurations, the keycap can be configured to move relative to the base structure and to deflect the first piezoresistor relative to the second and third piezoresistors, wherein deflection of the first piezoresistor relative to the second and third piezoresistors is configured to produce a threshold voltage at the voltage measurement device. The keyboard can also further comprise a collapsible dome, with the second and third piezoresistors being positioned between the collapsible dome and the base structure. The collapsible dome can be configured to move between a first stable position out of contact with a location of the first piezoresistor on the membrane and a second stable position contacting the location of the first piezoresistor on the membrane.

The first, second, and third piezoresistors can be connected in series by the conductive material. The conductive material and the first, second, and third piezoresistors can form a half-bridge circuit upon connection to the voltage source and the voltage measurement device.

The keyboard can also comprise a mechanical support attached to the keycap, wherein the membrane comprises a set of mechanical support openings between the keycap and the base structure. The set of mechanical support openings can extend parallel to a loading axis of the first piezoresistor. An unstressed resistance of the first piezoresistor can be equal to a sum of unstressed resistances of the second and third piezoresistors.

Yet another aspect of the disclosure relates to a membrane for a keyboard, with the membrane comprising a flexible substrate having a surface, a set of strain gauges positioned on the surface, a set of conductive traces positioned on the surface and at least partially overlapping the set of strain gauges, and a keycap vertically external to the set of strain gauges.

In some embodiments, the membrane can further comprise a cover layer positioned between the set of conductive traces and the keycap. The membrane can be attached to a relatively rigid layer, and at least one strain gauge of the set of strain gauges can be aligned with an opening in the relatively rigid layer. An insulating layer can also be positioned between least one conductive trace of the set of conductive traces and at least one additional conductive trace that overlaps the at least one conductive trace of the set of conductive traces.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
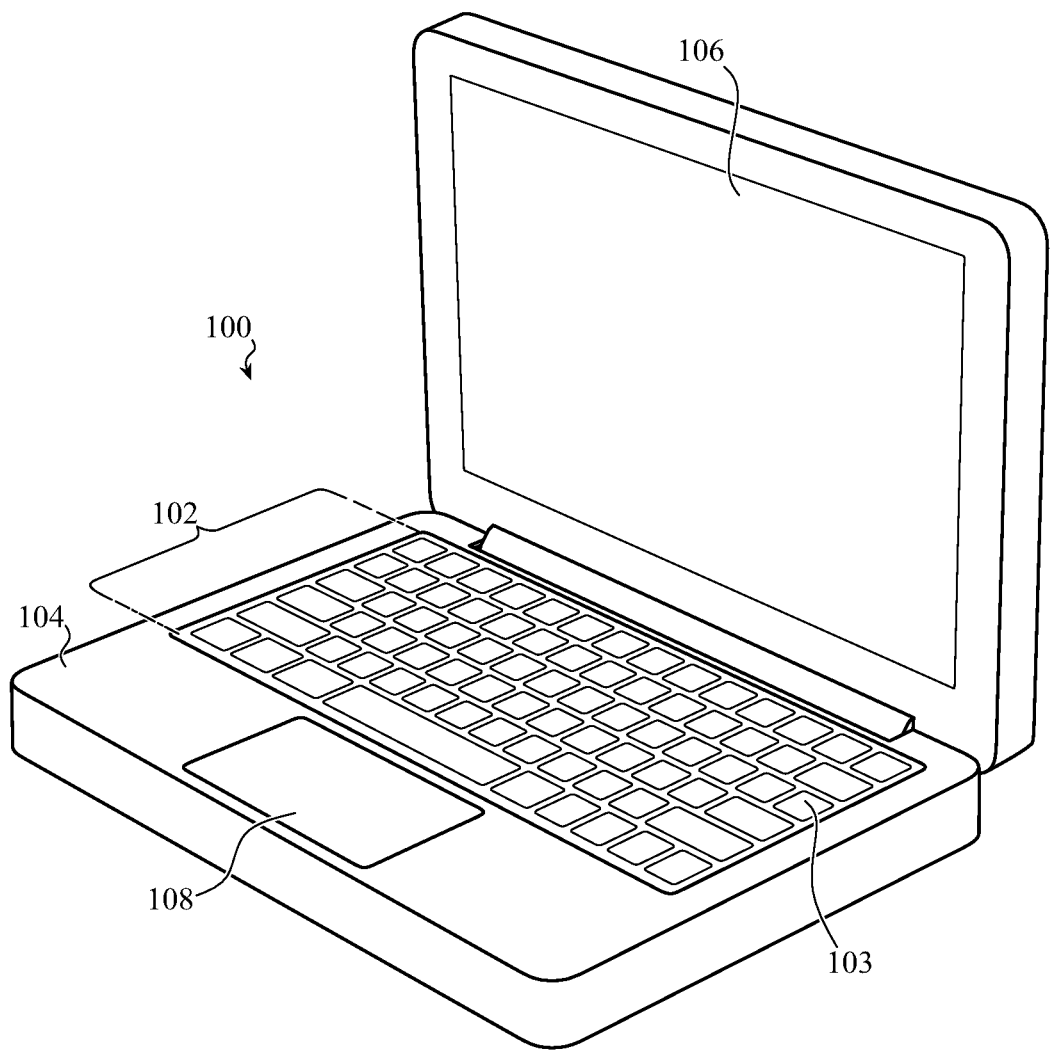
FIG. 1 shows an isometric view of an electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates generally to input devices for electronic devices, and more particularly to keyboard assemblies having reduced thicknesses.

In a keyboard assembly, a switch membrane can be used that provides electrical connectivity between the key switches and a keyboard controller. The membrane can therefore have conductive traces and connectors that engage and disengage when a keycap is pressed by the user. In some of these membranes, multiple layers of conductive materials are used. When a keycap is pressed, a conductive part of one layer is pressed into contact with another conductive part on another layer, thereby making an electrical connection that is detected by the controller. When the key is released, the conductors break their connection, and the controller detects that break. A sufficient downward force must be applied to the membrane in order to deflect the layers into contact. Over time, the reliability of making the electrical connection can diminish.

Keyboard membranes are susceptible to chemicals and liquids that degrade the glue holding the layers together. Moisture can get into the membrane via air venting channels and can corrode silver or other metallic conductors in the membrane. Embodiments of the present disclosure can help alleviate these issues and can thereby extend the life of a keyboard membrane while also reducing its thickness and adding new sensing capabilities to each key switch.

One aspect of the disclosure relates to using a printable polymer piezoresistive material to create a half-bridge strain gauge arrangement that can detect key make and break events. Each key assembly can have a half Wheatstone bridge strain gauge arrangement sitting under the key. The half-bridge can include a set of piezoresistive material strips, with a first portion of the strips having an equal resistance to a second portion thereof. The first portion can be split into two piezoresistive strain gauges that are symmetrically placed on the sides of a single, other piezoresistive strain gauge in the half bridge.

When a collapsible dome is collapsed by the user (e.g., by a key press), the dome can come into contact with a piezoresistor of the half-bridge (e.g., the second portion of the strips) and can affect the strain of this piezoresistor in a manner sufficient to detect the amount of force applied to the keycap. The force can be detected as a voltage as measured in the half bridge, wherein the voltage can indicate whether the keycap has been pressed or not. Sufficient force applied to the keycap can be detected as a key "make" event as the resistance of the central piezoresistor changes relative to the collective resistance of peripheral piezoresistors beyond a threshold value, and insufficient force can be detected as a key "break" event, wherein the central resistance is not sufficiently different from the combined resistance of the peripheral piezoresistors. In this manner, conductive material does not need to move between contacting or non-contacting positions in order to detect key make or break. No air venting is needed, so the membrane can be completely sealed against debris, condensation, spills, and other problematic intrusive materials, thereby extending its lifespan and reliability.

Furthermore, because conductors do not need to move relative to the membrane on which they are located, and because the strain gauges and half bridges can be positioned in substantially a single layer, the overall thickness of the membrane can be substantially reduced. The overall keyboard or other electronic device implementing the membrane can therefore have reduced thickness and weight.

Additionally, the keyboard can have a touch or force sensitivity based on the strain and detected voltage from a half-bridge. The keyboard can therefore have a customizable voltage threshold at which the controller can detect a "make" state (i.e., a state that indicates the key is activated by a user) instead of a "break" state (i.e., a state that indicates the key is not activated). Users with a heavier touch can set their keyboard with a higher required force/voltage/resistance difference threshold, and users with a lighter touch can have a lower threshold. Additionally, varying degrees of input force can be detected, wherein the magnitude or relative magnitude of the input force can be transduced due to being related to the amount of voltage produced by the strain gauges upon key press.

Embodiments of a strain-sensing switch can have binary operation, wherein the system is configured to discretely detect "on" or "make" versus "off" or "break" states based on the force applied to a key. Alternatively, some embodiments can have trinary (or non-binary) operation, wherein the system detects an "off" or "break" state versus two (or more) different "on" or "make" states. Each of the "make" states can correspond to different amounts of force applied to the key (i.e., a harder press versus a lighter press) or patterns or characteristics of two different forces applied to the keys (i.e., a long press versus a short press, or a high frequency series of taps versus a single tap), and a controller receiving the signals from the key can differently operate based on which kind of "make" state is detected. Furthermore, some embodiments can have analog or continuous operation, wherein a large (even infinite) set of "make" states can be detected when forces are applied to the key above a certain minimum threshold force. Continuous changes to the force applied to a key can cause continuous change in the operation of the keyboard controller (e.g., a connected electronic device), such as by continuously changing a graphic displayed in response to the key press (e.g., changing its opacity, size, or animation on the display).

These and other embodiments are discussed below with reference to the figures. However, those skilled in the art will readily appreciate that the detailed description given herein with respect to these figures is for explanatory purposes only and should not be construed as limiting.

FIG. 1 depicts an electronic device 100 including a keyboard 102. The keyboard 102 includes keys or key assemblies with keycaps 103 or button caps that move when depressed by a user. The electronic device 100 can also include a display screen 106, a track pad 108 or other pointing device, and internal electronic components used in a notebook/laptop computer (e.g., a processor, electronic memory device, electronic data storage device, and other computer components; not shown). The display screen 106 can be positioned on a portion of the housing 104 configured to extend upright relative to the keyboard 102. The track pad 108 can be positioned on the housing 104 adjacent to the keyboard 102 on a side of the keyboard 102 opposite the display screen 106.

Although the electronic device 100 of FIG. 1 is a notebook/laptop computer it will be readily apparent that features and aspects of the present disclosure that are described in connection with the notebook computer can be applied in various other devices. These other devices can include, but are not limited to, personal computers (including, for example, computer "towers," "all-in-one" computers, computer workstations, and related devices) and related accessories, tablet computers, speakers, graphics tablets and graphical input pens/styluses, watches, headsets, other wearable devices, and related accessories, vehicles and related accessories, network equipment, servers, screens, displays, and monitors, photography and videography equipment and related accessories, printers, scanners, media player devices and related accessories, remotes, headphones, earphones, device chargers, computer mice, trackballs, and touchpads, point-of-sale equipment, cases, mounts, and stands for electronic devices, controllers for games, remote control (RC) vehicles/drones, augmented reality (AR) devices, virtual reality (VR) devices, home automation equipment, and any other electronic device that uses, sends, or receives human input. Thus, the present disclosure provides illustrative and non-limiting examples of the kinds of devices that can implement and apply aspects of the present disclosure.

Figure 2:
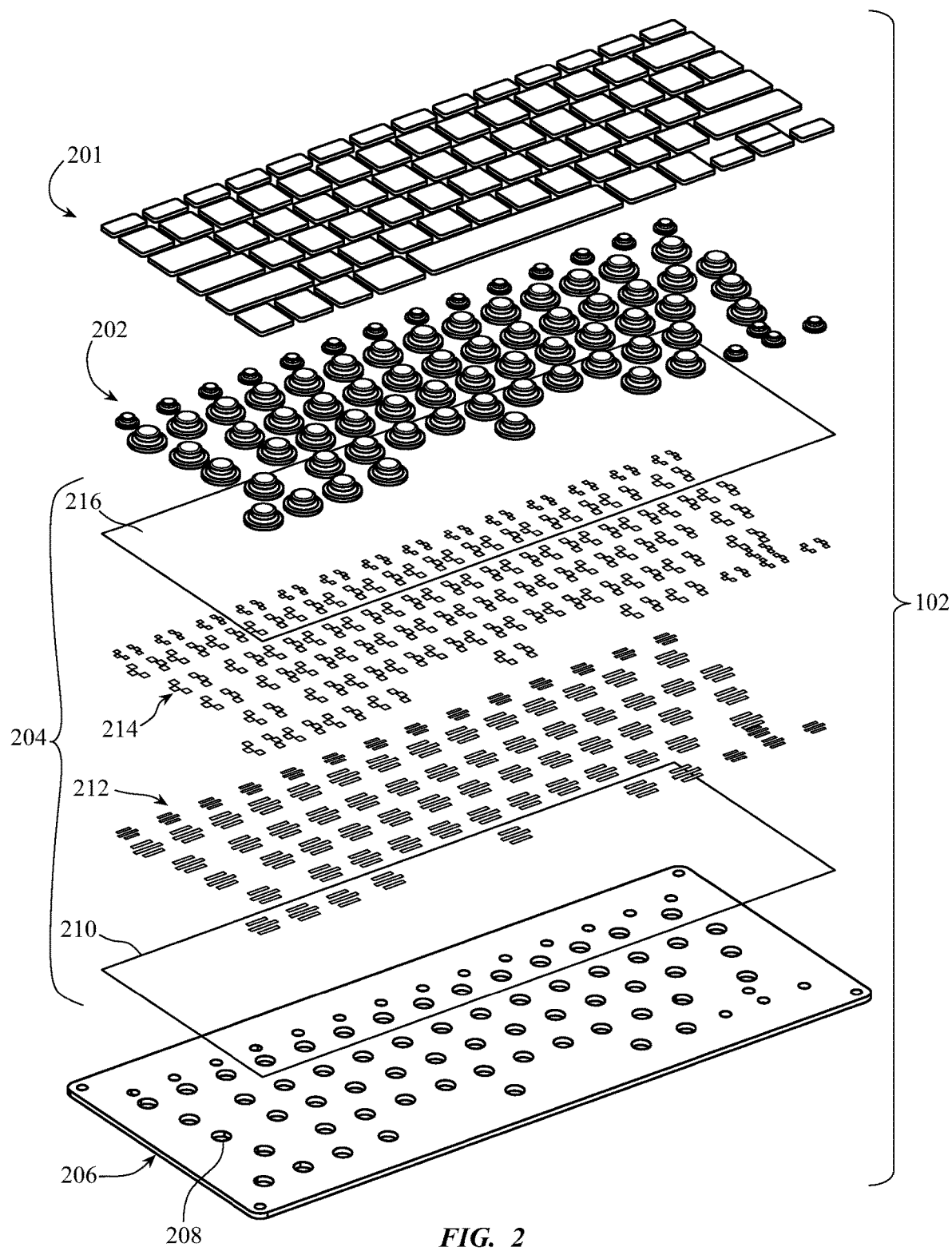
FIG. 2 shows an exploded view of a keyboard of the electronic device of FIG. 1.

The keyboard 102 can include a set of assembled components that correspond to each key. The assembly of these components can be referred to as a "stack-up" due to their substantially layered or stacked configuration. FIG. 2 illustrates an exploded view of a keyboard assembly 200 that can be implemented as part of an electronic device such as a peripheral keyboard input device or a built-in keyboard (e.g., 102) for a laptop (e.g., device 100), tablet computer, portable electronic device, computer accessory, or other computer component. The keyboard assembly 200 can have a set of keycaps 201, with at least one being used in connection with each key or button of the keyboard. One or more switch structures 202 (e.g., collapsible domes, springs, or other biasing devices) can be positioned underneath the keycaps 201. In some cases, the switch structures 202 can be interconnected as a sheet (e.g., a flexible dome sheet). A membrane 204 can be positioned below the switch structures 202, and a base layer 206 can be positioned below the membrane 204. The base layer 206 can comprise a set of recesses, openings, or apertures (e.g., 208) aligned with each of the switch structures 202.

The membrane 204 can comprise a bottom layer 210, a set of strain gauges 212 positioned on the bottom layer 210, a set of conductive traces 214 (see also FIG. 4) positioned on the bottom layer 210 and connecting the set of strain gauges 212 to an input-output connector or keyboard controller (not shown), and a mask layer 216 located on top of the strain gauges 212 and conductive traces 214. See FIGS. 2-4 and 6-8. The bottom layer 210 can comprise a flexible or substantially rigid material such as, for example, polyethylene terephthalate (PET). The bottom layer 210 and mask layer 216 can comprise transparent or translucent materials to permit light transmission through the membrane 204. In some embodiments, a light source (not shown) may be associated with the membrane to provide light to a lower side of the keycap 201, illuminating a symbol, indicia or other portion of the keycap 201. In some embodiments, the light source may be integrated into the membrane 204, positioned above the membrane, or positioned below the membrane with light from the light source passing through the membrane 204 to the keycap 201.

Figure 3:
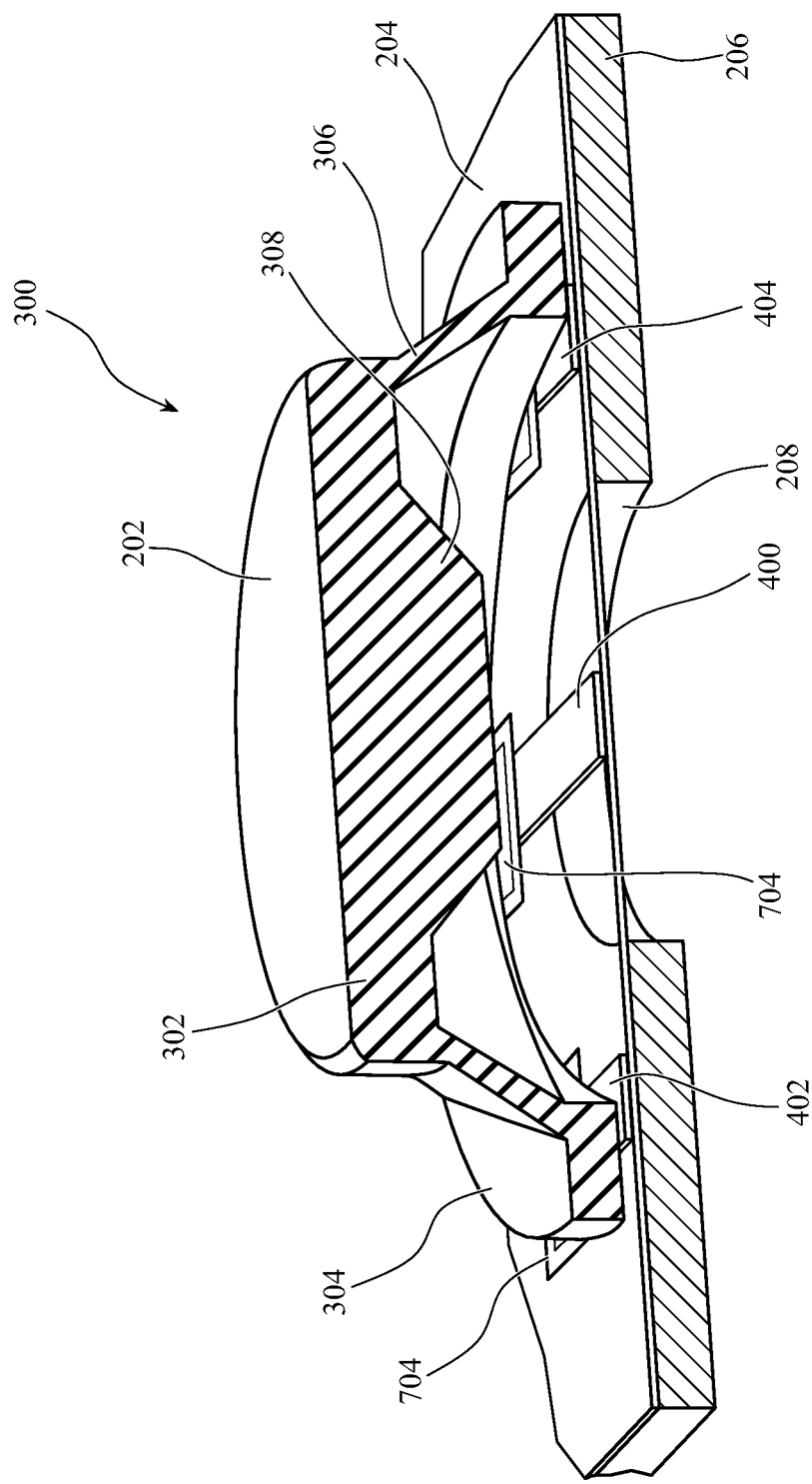
FIG. 3 is an isometric section view of a key assembly of the keyboard of FIG. 2.

FIG. 3 shows a section view of one of the key assemblies 300 in the keyboard assembly 200. In the key assembly 300, the switch structure 202 comprises a top portion 302 that is vertically movable relative to a base portion 304 that is mounted to or in contact with the membrane 204. A wall portion 306 can link the top and base portions 302, 304 in a generally conical or dome-like shape. The top portion 302 can have an inner, downward-extending protrusion 308 extending into the hollow internal cavity formed by the top portion 302 and the wall portion 306 and that faces the membrane 204. Collapsing the switch structure 202 can drive the protrusion 308 into contact with the membrane 204 at a strain gauge 400.

Figure 4:
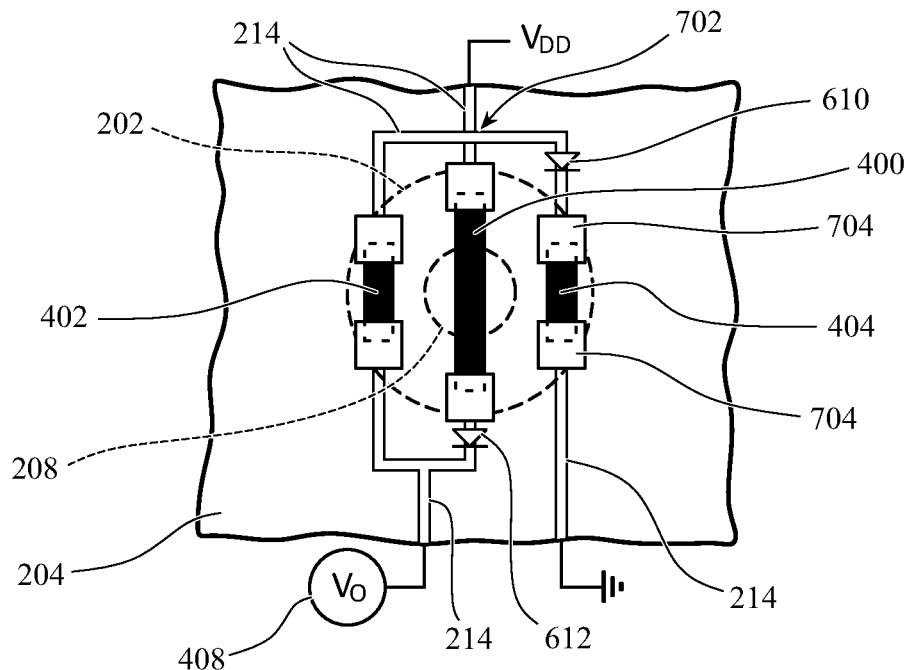
FIG. 4 is a top view of a set of strain gauges on a membrane of a keyboard.

FIG. 4 shows a top view of the membrane 204 on the base layer 206 below the switch structure 202 of FIG. 3. In this view, the outer circumference of the switch structure 202 is shown as a broken line, and the outer circumference of the opening 208 is shown as a broken line. A set of strain gauges 400, 402, 404 are electrically connected to each other in the membrane 204 and underneath the switch structure 202. The strain gauges 400, 402, 404 can be piezoresistors or can comprise piezoresistive material such as a carbon-based ink or other material that has low thermal sensitivity (i.e., thermal expansion or contraction). Accordingly, the resistance of the strain gauges can change in response to changes in strain present within the strain gauges 400, 402, 404.

Figure 5:
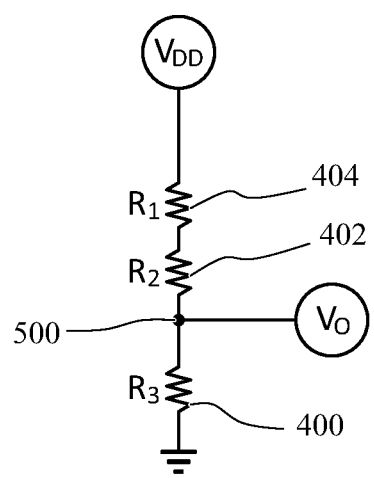
FIG. 5 is a circuit diagram of a set of strain gauges used in a membrane of a keyboard.

FIG. 5 shows a simplified circuit diagram showing how the strain gauges 400, 402, 404 are connected to each other. In this diagram, the strain gauges 400, 402, 404 are connected in a half Wheatstone bridge circuit that is provided a drive voltage by a signal generator VDD and is connected to a voltmeter Vo and ground. The voltmeter Vo can be connected between strain gauges 400 and 402. Strain gauges 402 and 404 can have equal unstressed resistance, and the sum total unstressed resistance of strain gauges 402 and 404 can be equal to the unstressed resistance of strain gauge 400. As used herein, the strain gauges are "unstressed" when they are at rest and not being acted upon by the user or by movement of the switch structure 202. Accordingly, their "unstressed resistance" refers to their resistance when the keycap 103 and switch structure 202 are at a raised, unpressed position.

Due to the nature of the half bridge configuration, a change in the resistance of strain gauge 400 can be detected as a change in voltage as measured by the voltmeter Vo. Additionally, a change in the resistance in all three strain gauges 400, 402, 404 can result in little or no change in voltage as measured by the voltmeter Vo when the resistance on each side of the measurement point 500 changes substantially equally. The signal generated at the voltmeter Vo can be linearly related to the force applied to the strain gauges 400, 402, 404 because the applied force linearly changes the strain and resistance in the strain gauges 400, 402, 404.

Referring again to FIG. 4, the strain gauges 400, 402, 404 are positioned underneath and within the circumference of the switch structure 202. The central strain gauge 400 can be vertically aligned with the center of the switch structure 202 and the opening 208 of the base layer 206. The peripheral strain gauges 402, 404 can be positioned on the membrane 204 radially external to and non-overlapping with the opening 208 while still being underneath the switch structure 202. The peripheral strain gauges 402, 404 can also be symmetrically spaced apart from the central strain gauge 400.

In this manner, the strain gauges 400, 402, 404 are in close proximity to each other in the electronic device and within the keyboard 102. They can therefore have an approximately equal internal temperature, and they are subjected to substantially equal pretension forces (and strain) when the switch structure 202 is not collapsed and when the protrusion 308 or top portion 302 are not in contact with the membrane 204. Additionally, they are not separated from each other by long distances or by long lengths of conductive traces 214. For this reason, the voltage measurement at the voltmeter 408 can be about zero when a keycap 103 is not operated because the resistance of the central strain gauge 400 is equal to the total resistance of the peripheral strain gauges 402, 404.

In some embodiments, an initial voltage measurement can be frequently sensed by the controller (e.g., every few seconds), and the initial voltage can be compared to the driven voltage. Then, whenever the magnitude voltage measurement at the voltmeter 408 surpasses a threshold minimum value, the controller can determine that a key has been pressed. Therefore, the measured voltage level for an unpressed key can vary with temperature or other conditions while still allowing the system to determine when the key is pressed.

When a keycap 103 is pressed, the switch structure 202 can be configured to collapse into contact with the central strain gauge 400. Contact with the central strain gauge 400 can cause it to at least slightly deflect downward with the bottom layer 210 into the opening 208, thereby increasing strain in the central strain gauge 400 relative to the peripheral strain gauges 402, 404. The strain in the peripheral strain gauges 402, 404 can also change as the switch structure 202 collapses, but the greater size and amount of deflection of the central strain gauge 400 can cause a greater change in its strain as compared to the peripheral strain gauges 402, 404. The increase in strain in the central strain gauge 400 can cause its resistance to increase beyond the combined resistance of the peripheral strain gauges 402, 404 even if the combined resistance of the peripheral strain gauges 402, 404 increases to a degree at the same time. Accordingly, a voltage measurement at the voltmeter 408 can be non-zero when the keycap 103 is operated. See also FIGS. 9 and 10 and their related descriptions herein.

In some embodiments, the switch structure 202 can be omitted. In such cases, contact between the bottom of the keycap 103 and the membrane 204 can cause the system to detect a key press. The keycap 103 can be biased away from the membrane 204 by another elastic component (e.g., a compressible body or spring) that does not contact the strain gauges 400, 402, 404. In some embodiments, a haptic engine (e.g., a piezoelectric motor) can be provided for one or more keys, wherein tactile feedback (e.g., a click or vibration) can be generated at the keycap when the keycap is pressed with sufficient force.

Additionally, the magnitude of the voltage at the voltmeter 408 can be proportional to the amount of force applied to the keycap 103. For example, the voltage can be linearly related to the magnitude of the applied force. Accordingly, the keycap 103 can be pressed until a threshold voltage is measured in the membrane 204. When that threshold is reached, the controller (which receives the measurements of the voltmeter 408 or that operates as the voltmeter 408) can register a key "make" state and can therefore determine that the key has been pressed. See also FIGS. 9 and 10 and their related descriptions herein.

In some embodiments, multiple different key "make" states can be output from the controller. For example, different key "make" states can be detected by the controller based on varying magnitudes of the voltage measured by voltmeter 408. For example, for a heavier typist pressing on the keycaps 103 with more force than an average user, the controller can be configured to provide a key "make" when a higher than average voltage is measured by the voltmeter 408. In another example, with a lighter typist, the controller can be configured to provide a key "make" when a lower than average voltage is measured. In some embodiments, the user can provide input to the controller to determine the sensitivity of the keyboard to input forces. For example, the user can determine and provide a customized key "make" voltage threshold or force.

Additionally, in some embodiments, the controller can be configured to produce multiple different signals in response to multiple different levels of input forces. For instance, pressing a keycap 103 with a first, low amount of force can cause the controller to provide a first type of signal, and pressing the keycap 103 with a second, higher amount of force can cause the controller to provide a second type of signal. The first signal can be a normal key "make" signal (e.g., a lowercase or normal letter), and the second signal can be different key "make" signal (e.g., an uppercase or bold letter). Similarly, different signals can cause the keyboard to produce different types of inputs (e.g., letters versus numbers or other symbols) or different degrees of inputs (e.g., causing a game character to walk versus run or causing the volume of the computer to change more quickly in response to higher force input).

Figure 6:
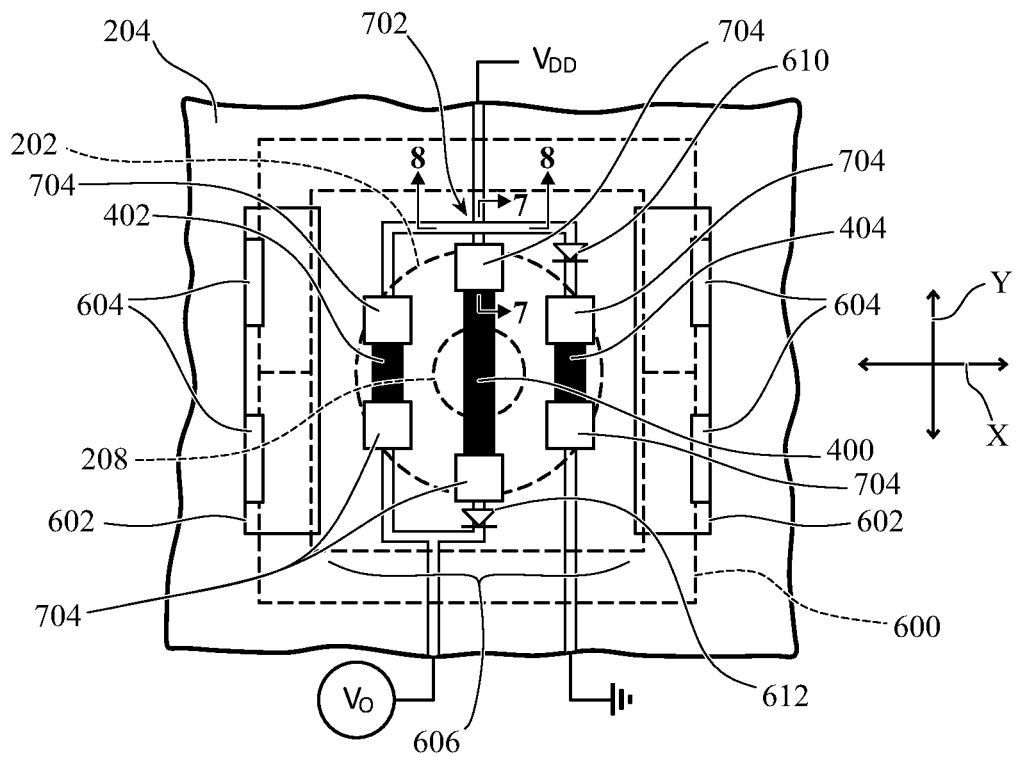
FIG. 6 is a top view of a set of strain gauges on a membrane of a keyboard according to another embodiment of the present disclosure.

As shown in FIG. 6, the keyboard assembly 200 can also include a set of keycap stabilizers 600 (e.g., scissor or butterfly hinge support mechanisms) configured to help the keycaps 103 remain substantially horizontal and parallel to the base layer 206 when the keycaps 103 are pressed down on an edge or corner. FIG. 6 shows a top view of a membrane 204 having openings 602 through which the stabilizers 600 can extend to attach to the base layer 206. For example, brackets 604 can be positioned on the base layer 206 and can be pivotally attached to the stabilizers 600. Similar connectors can be positioned on the underside of the keycaps 103. The openings 602 can have elongated shapes, wherein they have relatively lengthened dimensions along an axis Y as compared to their dimensions along a perpendicular axis X.

A strip 606 of membrane material can bear the strain gauges 400, 402, 404 between the openings 602. The strip 606 can extend over the opening 208 in the base layer 206. The strain gauges 400, 402, 404 can be parallel to each other on the strip 606 and can be parallel to a longitudinal axis of the strip 606 and parallel to the elongated axes (e.g., axis Y) of the openings 602. Accordingly, the strain gauges 400, 402, 404 can have parallel primary stress axes, wherein the primary stress axes are defined along the direction primary bending of the strip 606 when the keycap 103 is depressed.

When the switch structure 202 collapses, it can produce strain in the strip 606 (e.g., by elongation in the strip 606) that is greater in the direction of the longitudinal axis Y of the strip 606 than in the direction of the perpendicular axis X. This can be influenced by the presence of the openings 602, which allow the edges of the strip 606 at the openings 602 to flex inward (i.e., toward the opening 208) when the central strain gauge 400 and which allow the membrane 204 to flex downward at the opening 208. Accordingly, the membrane 204 can have the strain gauges 400, 402, 404 extending parallel to the edges of the strip 606 (i.e., the edges of the openings 602) in order to maximize the amount of elongation at the strain gauges 400, 402, 404 and thereby maximize the amount of strain and resistance change in the strain gauges 400, 402, 404 when a key is pressed. The alignment of the strain gauges 400, 402, 404 with the strip 606 can therefore make the detection of a key press (or other voltage change) more sensitive since they are aligned with a loading axis of the strip 606 (that is parallel to the axis Y). The loading axis can be the major axis of bending in the strip 606 when the switch structure 202 collapses.

As shown in FIGS. 4 and 6, in some embodiments, a set of diodes 610, 612 can be positioned between pairs of the strain gauges 400, 402, 404. The diodes 610, 612 can be used to prevent key ghosting at a controller of the keyboard 102 by preventing back-feeding of signals and by allowing multiple sets of strain gauges 400, 402, 404 (e.g., multiple key assemblies in a column of keys) to be connected to each other by a common conductor that leads to the controller.

Figure 7:
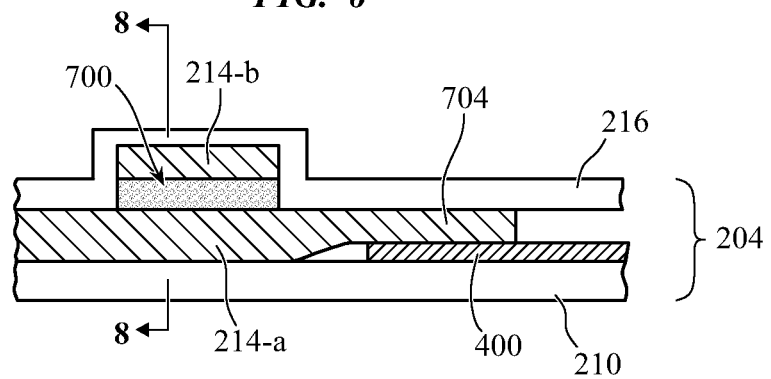
FIG. 7 is a section view of the membrane of FIG. 6 as taken through section lines 7-7.
Figure 8:
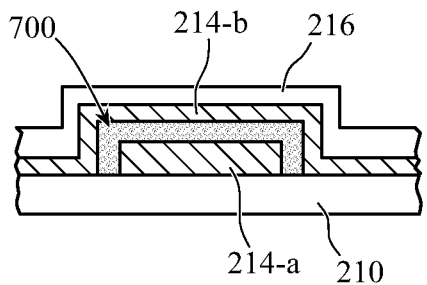
FIG. 8 is a second view of the membrane of FIG. 6 as taken through section lines 8-8.

FIGS. 4 and 6-8 also show how portions of the membrane 204 can comprise an insulator layer 700 between some segments of the conductive traces 214. FIG. 7 is a diagrammatic side section view of the membrane 204 as taken through section lines 7-7 in FIG. 6. FIG. 8 is a diagrammatic side section view of the membrane 204 as taken through section lines 8-8 in FIGS. 6 and 7. For example, the insulator layer 700 can be implemented at crossing junctions 702 (see FIGS. 4 and 6) on the membrane 204.

To construct the membrane 204, the strain gauges 400, 402, 404 can be applied or attached to the bottom layer 210. For example, the strain gauges 400, 402, 404 can comprise a piezoresistive material (e.g., a polymer piezoresistive material) that is adhered, jet printed, screen printed, or otherwise affixed to the top surface of the bottom layer 210. As shown in FIG. 7, strain gauges (e.g., 400) can be attached to the bottom layer 210 without any intervening components between the bottom layer 210 and the gauge material. In this manner, the movement and strain in the strain gauges 400, 402, 404 can closely match the movement and strain in the bottom layer 210.

The conductive traces 214 can also be applied to the bottom layer 210. In some embodiments, the traces 214 comprise a silver or similar conductive material configured to be applied to the bottom layer 210 using a printing, etching, or related method. The traces 214 can comprise conductive pads 704 that are applied over top surfaces of the strain gauges 400, 402, 404 (as shown in FIGS. 3, 4, 6, and 7) and that are enlarged in width as compared to the linear traces 214. Some of the conductive traces 214-a can be applied with gaps in linear segments of the traces where insulator layer 700 will be applied. In some embodiments, the diodes 610, 612 can be printed or otherwise attached or deposited onto the bottom layer 210 or onto the conductive traces 214.

In some embodiments, the insulator/insulating layer 700 can then be applied to the top surfaces of the traces 214 or conductive pads 704 that will vertically overlap with a second conductive trace (e.g., trace 214-b which overlaps trace 214-a in FIGS. 7 and 8). The insulator layer 700 can therefore locally insulate the lower trace 214-a from the upper trace 214-b without covering, and thereby thickening, the entire surface area of the membrane 204. In some configurations, the insulator layer 700 can extend across the entire top surface of the membrane 204 except where upper traces 214-b need to connect to the lower traces 214-a. After application of the insulator layer 700, the upper conductive traces 214-b can be applied to the insulator layer 700 and can establish an electrical connection between segments of the conductive traces 214 on each side of the insulator layer 700 locations.

The mask layer 216 can be applied to the top of all of the lower layers and traces to protect the conductive materials therein from damage and exposure. Accordingly, the conductive traces 214, pads 704, and strain gauges 400, 402, 404 can all be sealed within the membrane 204. In some embodiments, the membrane 204 can be fluid-tight and can therefore prevent any contact between the conductive elements of the membrane 204 and any liquid or other debris that falls into the keyboard 102. Therefore, the membrane 204 can have improved durability and protection against electrical shorting and related problems. The mask layer 216 can comprise a material similar to the bottom layer 210.

Where no insulator layers 700 are located, the overall thickness of the membrane 204 can be within a range of about 70-200 microns, about 80-100 microns, or about 91 microns. With an insulator layer 700 and conductive trace 214-b, the overall thickness of the membrane 204 can be within a range of about 100-200 microns, about 110-160 microns, or about 131 microns. Accordingly, the overall thickness of the membrane 204 can be substantially smaller than the overall thickness of multi-layer membranes wherein internal conductors have to bend or translate into contact with each other across an air gap. For this reason, membranes of the present disclosure can beneficially be used in smaller, thinner devices since less space is needed the stack-up of such devices for the keyboard.

The process used to apply the conductive pads 704 to the strain gauges 400, 402, 404 can be a high-precision process. The length of the strain gauges 400, 402, 404 between the conductive pads 704 can define the default or unstressed resistance of the gauges. Accordingly, for gauges with equal thickness and width, the pads 704 can be applied symmetrically on the peripheral gauges 402, 404 and in a manner ensuring that each peripheral gauge has equal length between the pads 704. This ensures that each of the peripheral gauges 402, 404 have the same resistance and have the same change in resistance when the switch structure 202 moves and collapses. The peripheral gauges 402, 404 thereby also help compensate for temperature changes at the membrane 204 due to being equal in resistance and size and due to being nearby each other while being in series with each other and with the central strain gauge 400. If the central strain gauge 400 has the same width and thickness as the peripheral gauges 402, 404, the pads 704 for the central gauge 400 can be spaced apart along twice the length along the central gauge 400 as compared to the length between the pads 704 on the peripheral gauges 402, 404.

Figure 9:
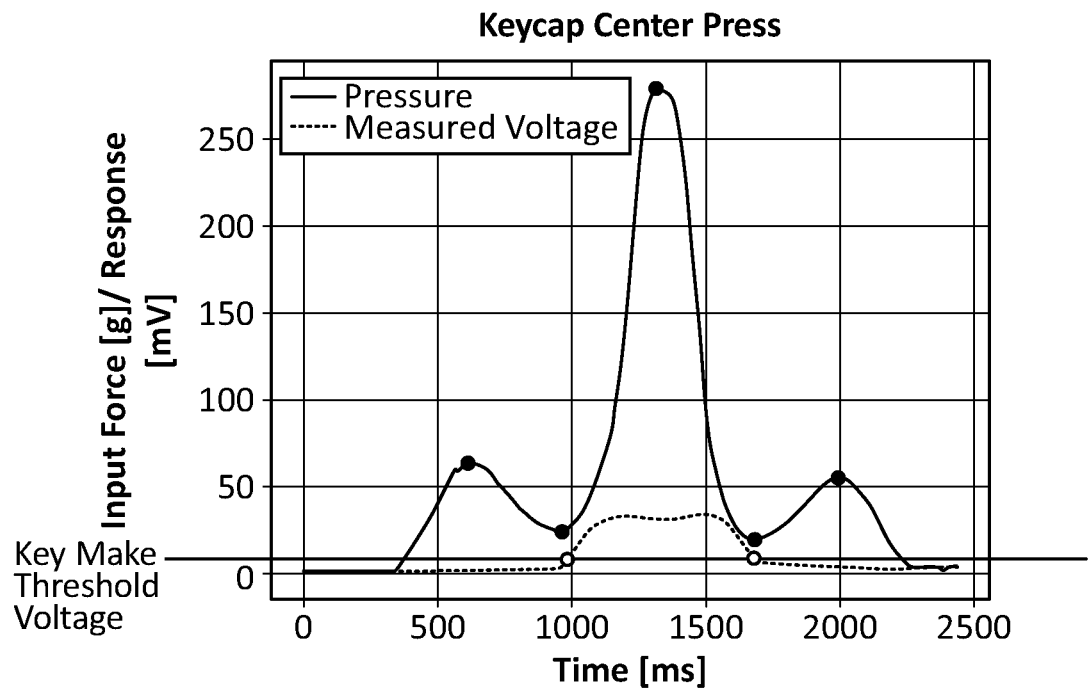
FIG. 9 is a plot of input force and voltage response of a central key press on a circuit of a keyboard membrane over time.
Figure 10:
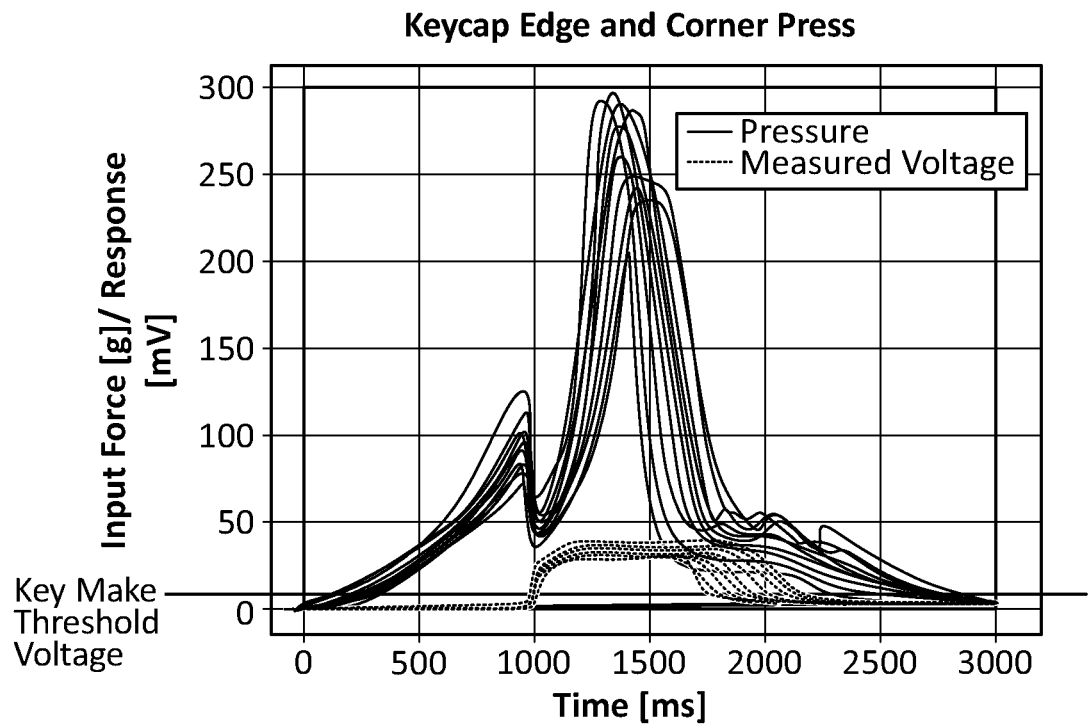
FIG. 10 is a plot of input force and voltage response of various off-center key presses on a circuit of a keyboard membrane over time.

FIGS. 9 and 10 are plots of the input force and measured voltage response over time during a key press. FIG. 9 shows data for a press of a user instrument at the center of a keycap 103 (i.e., the key is pressed directly over a switch structure 202), and FIG. 10 shows a set of data for a set of multiple different presses of the user instrument at the edges and corners of the keycap 103.

As shown in FIG. 9, at time zero, the keycap 103, switch structure 202, and membrane 204 are at rest. There is no applied force, and there is no significant output voltage since there is an equal ratio of the resistance of the central strain gauge 400 to the resistance of the peripheral strain gauges 402, 404. The system can therefore be calibrated under this condition in a manner setting the output voltage to about zero.

At about 400 milliseconds, a key press begins, as indicated by the rise in the applied force. The output voltage also begins to increase due to the deformation of the switch structure 202 attached above the strain gauges 400, 402, 404. However, the output voltage does not change dramatically and stays below the key make threshold voltage because the switch structure 202 imparts approximately equal strain to each of the strain gauges 400, 402, 404 as the membrane 204 reacts to the deformation of the switch structure 202.

When the input force reaches a mid-stroke peak (i.e., a tactile peak force) at about 600 milliseconds, the switch structure 202 begins to collapse from its first, raised, stable position to its second, depressed, stable position, thereby reducing the force required to continue moving the keycap 103 downward. At about 950 milliseconds, the switch structure 202 comes into contact with the central strain gauge 400. At that point, the output voltage changes significantly due to the central strain gauge 400 being under significantly more strain than the peripheral strain gauges 402, 404. The output voltage therefore exceeds the key make threshold voltage for the first time. At this point, the force input also increases dramatically because the user instrument and keycap 103 are now compressing the switch structure 202 against the membrane 204 while the switch structure 202 and membrane 204 are in contact with each other.

At about 1300 milliseconds, the force on the keycap 103 is reduced, and the switch structure 202 begins to rebound and bias the keycap 103 upward, transitioning from its stable collapsed state (i.e., the second stable position) to its stable uncollapsed state (i.e., the first stable position). Accordingly, the switch structure 202 can be a bistable structure but can also be configured to resiliently rebound from the stable collapsed state to the stable uncollapsed state. When the switch structure 202 moves out of contact with the central strain gauge 400, the output voltage drops below the key make threshold voltage again, and the controller receiving the output voltage measurement therefore can determine that the key is no longer being pressed.

Notably, the output voltage can change while the switch structure 202 is in contact with the central strain gauge 400. For this reason, the output voltage can be used as a control signal for distinguishing between a range of possible inputs such as, for example, a light key press, a heavy key press, a key press with increasing force, a key press with decreasing force, a key press under wavering force, related inputs, and combinations thereof. The keyboard can therefore be advantageously used to receive variable types of input from a single keycap rather than only receiving a key "make" or "break" signal.

Additionally, in some embodiments, the key make threshold voltage can be user-controlled or system-controlled in a manner that enables the threshold voltage to be higher or lower under different conditions. For instance, a lighter typist can choose a lower threshold, and a heavier typist can choose a higher threshold. In some cases, each key can be individually configured with different threshold voltages and, therefore, different threshold key press weights. The system can be configured to learn a user's typing characteristics, such as by detecting lighter (or heavier) user input on the keys, and can then automatically decrease (or increase) the key make threshold to adapt to the user's characteristics. For instance, the keyboard controller or a connected electronic device can receive force measurements based on the user input to the keyboard. The force measurements can be analyzed for behavior indicative of user errors based on application of force that is too light or too heavy for the keyboard in its current configuration. For example, the user errors can include detecting a set of key presses that are indicative of a failure to apply enough force to actuate a "make" state (e.g., a set of presses that is too light to exceed the minimum force threshold followed by a set of similar key presses that is heavier or detecting a set of key presses that are repeated after a minimum force threshold fails to be exceeded) or detecting a set of key presses that are indicative of an inadvertent key press (e.g., a light key press is usually followed by a backspace key press, but heavier key presses are not). The controller can then compensate for these errors by increasing or decreasing the key make threshold to reduce the number of inadvertent key presses or to register intentional key presses that seem to be going unregistered due to lack of input force. This can make the keyboard more comfortable for the user since a user with a lighter touch does not need to press harder than desired, and a user with a heavier touch can have fewer unintentional key presses registered.

As shown in FIG. 10, when an input force is applied to the edges and corners of a keycap 103, the voltage output response can be similar to the output when the keycap is centrally pressed. In other words, at about 1000 milliseconds, the output voltage can exceed the key make threshold voltage, and that is after the switch structure 202 has collapsed into contact with the membrane 204. Similarly, releasing the force on the keycap 103 allows the switch structure 202 to rebound and leads to the output voltage falling below the key make threshold voltage again. Accordingly, although in some traditional keyboards a key press cannot be detected when applied at a corner or peripheral edge of the keycap, the sensitivity of the membrane 204 of the present disclosure is sufficient to detect a key press at any location on top of the keycap 103. Thus, the need for a key stabilizer (e.g., 600) in addition to the switch structure 202 is reduced or eliminated as compared to a traditional keycap with a collapsible dome that causes deflection of conductive material into contact with other conductive material. Additionally, the minimum thickness and rigidity of the keycap 103 can be reduced.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A keyboard, comprising:
   a base;
   a keycap configured to translate relative to the base along an axis; and
   a membrane layer positioned between the keycap and the base, the membrane layer including:
      a flexible sheet;
      a first strain gauge positioned on the flexible sheet between the keycap and the base, the first strain gauge being aligned with the axis;
      a second strain gauge positioned on the flexible sheet between the keycap and the base, the second strain gauge being spaced apart from the axis; and
      a conductor positioned on the flexible sheet and connecting the first and second strain gauges in a half bridge configuration.

2. The keyboard of claim 1, wherein the first strain gauge has a first unstressed resistance and the second strain gauge has a second unstressed resistance, the keyboard further comprising:
   a mechanical support linking the keycap to the base;
   a third strain gauge positioned on the flexible sheet between the keycap and the base at a position opposite the second strain gauge relative to the first strain gauge, the third strain gauge having a third unstressed resistance, the second unstressed resistance being equal to the third unstressed resistance, the first unstressed resistance being approximately equal to a sum of the second and third unstressed resistance;

a collapsible dome associated with the first, second, and third strain gauges, the collapsible dome configured to collapse to deflect the first strain gauge more than the second or third strain gauges.

3. The keyboard of claim 1, wherein the flexible sheet comprises a keycap-facing surface, wherein the first and second strain gauges are both positioned on the keycap-facing surface.

4. The keyboard of claim 1, wherein the first strain gauge comprises a first primary stress axis and the second strain gauge comprises a second primary stress axis, the first and second primary stress axes being parallel.

5. The keyboard of claim 1, wherein the base comprises a recess or opening aligned with the axis, wherein the first strain gauge is deflectable into the recess or opening.

6. The keyboard of claim 1, wherein the base comprises a recess or opening vertically aligned with the keycap, wherein the second strain gauge is positioned on the flexible sheet spaced apart from the recess or opening.

7. The keyboard of claim 1, further comprising a third strain gauge positioned on the flexible sheet between the keycap and the base.

8. The keyboard of claim 1, further comprising a collapsible dome positioned between the keycap and the base and configured to deflect the first strain gauge upon collapse.

9. A keyboard, comprising:
a base structure;
a keycap;
a membrane positioned between the base structure and the keycap;
a first piezoresistor, a second piezoresistor, and a third piezoresistor positioned on the membrane between the keycap and the base structure, the second and third piezoresistors being symmetrically positioned on opposite sides of the first piezoresistor; and
a conductive material configured to link the first, second, and third piezoresistors to a voltage source and to a voltage measurement device.

10. The keyboard of claim 9, wherein the keycap is configured to move relative to the base structure and to deflect the first piezoresistor relative to the second and third piezoresistors, wherein deflection of the first piezoresistor relative to the second and third piezoresistors is configured to produce a threshold voltage at the voltage measurement device.

11. The keyboard of claim 9, further comprising a collapsible dome, the second and third piezoresistors being positioned between the collapsible dome and the base structure.

12. The keyboard of claim 11, wherein the collapsible dome is configured to move between a first stable position out of contact with a location of the first piezoresistor on the membrane and a second stable position contacting the location of the first piezoresistor on the membrane.

13. The keyboard of claim 9, wherein the first, second, and third piezoresistors are connected in series by the conductive material.

14. The keyboard of claim 9, wherein the conductive material, and the first, second, and third piezoresistors form a half-bridge circuit upon connection to the voltage source and the voltage measurement device.

15. The keyboard of claim 9, further comprising a mechanical support attached to the keycap, wherein the membrane comprises a set of mechanical support openings between the keycap and the base structure, the set of mechanical support openings extending parallel to a loading axis of the first piezoresistor.

16. The keyboard of claim 9, wherein an unstressed resistance of the first piezoresistor is equal to a sum of unstressed resistances of the second and third piezoresistors.

17. A keyboard comprising:
a membrane comprising:
a flexible substrate having a surface;
a set of strain gauges positioned on the surface;
a set of conductive traces positioned on the surface and at least partially vertically overlapping the set of strain gauges; and
a keycap associated with the set of strain gauges.

18. The keyboard of claim 17, further comprising a cover layer positioned between the set of conductive traces and the keycap.

19. The keyboard of claim 17, wherein the membrane is attached to a relatively rigid layer and at least one strain gauge of the set of strain gauges is aligned with an opening in the relatively rigid layer.

20. The keyboard of claim 17, further comprising at least one additional conductive trace positioned vertically overlapping the at least one conductive trace and an insulating layer positioned between at least one conductive trace of the set of conductive traces and the at least one additional conductive trace.

* * * * *